United States Patent
Park et al.

(10) Patent No.: US 7,589,941 B2
(45) Date of Patent: Sep. 15, 2009

(54) FAULT CURRENT LIMITER HAVING SUPERCONDUCTING BYPASS REACTOR FOR SIMULTANEOUS QUENCHING

(75) Inventors: Dong-Keun Park, Seoul (KR); Min-Choel Ahn, Paju-si (KR); Seong-Eun Yang, Seoul (KR); Tae-Kuk Ko, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 307 days.

(21) Appl. No.: 11/567,654

(22) Filed: Dec. 6, 2006

(65) Prior Publication Data
US 2007/0217097 A1 Sep. 20, 2007

(30) Foreign Application Priority Data
Mar. 2, 2006 (KR) ...................... 10-2006-0019821

(51) Int. Cl.
*H02H 9/00* (2006.01)
(52) U.S. Cl. .......................... 361/19; 361/58

(58) Field of Classification Search ................. 361/19, 361/58; 505/231, 850
See application file for complete search history.

(56) References Cited

U.S. PATENT DOCUMENTS

| 5,021,914 | A | * | 6/1991 | Tsurunaga et al. | ............ 361/19 |
| 6,081,987 | A | * | 7/2000 | Kalsi et al. | ...................... 29/599 |
| 6,601,289 | B1 | * | 8/2003 | Kobayashi | ................... 29/599 |
| 2005/0088790 | A1 | * | 4/2005 | Shah et al. | ...................... 361/19 |

* cited by examiner

*Primary Examiner*—Danny Nguyen
(74) *Attorney, Agent, or Firm*—Holme Roberts & Owen LLP (57) ABSTRACT

A fault current limiter comprises a pancake type current limiting module, comprising at least two pancake type bifilar winding modules stacked and connected to each other in series, each of the bifilar winding modules having a bobbin, a first superconducting wire wound around the bobbin in a bifilar manner, and at least one pair of first metal blocks installed and fixed to the bobbin and attached to the first superconducting wire; and a superconducting bypass reactor that has the current limiting module disposed therein, and is connected in parallel with the current limiting module.

7 Claims, 7 Drawing Sheets

FAULT CURRENT LIMITER HAVING SUPERCONDUCTING BYPASS REACTOR FOR SIMULTANEOUS QUENCHING

CROSS-REFERENCE TO RELATED APPLICATION

This application claims priority to and the benefit of Korean Patent Application No. 10-2006-0019821 filed with the Korean Intellectual Property Office on Mar. 2, 2006, the entire content of which is incorporated herein by reference.

BACKGROUND OF THE INVENTION

1. Field of the Invention

The present invention relates generally to fault current limiters having superconducting bypass reactors for simultaneous quenching and, more particularly, to a fault current limiter having a superconducting bypass reactor for simultaneous quenching in which, when quenching occurs in a current limiting module, current is bypassed into a superconducting bypass reactor to generate a magnetic field that is evenly applied to the current limiting module provided in the bypass reactor. This causes simultaneous quenching, thus preventing multiple winding modules in the current limiting module from being damaged when voltage is concentrated in one winding module.

2. Description of the Related Art

As is well known to those skilled in the art, fault current limiters (FCLs) in power systems serve to limit mechanical, thermal and electrical stress applied to busbars, electrical insulators, circuit breakers, etc. when a fault current occurs due to short-circuits. Due to an increase in the number of short-circuits and difficulty in the development of power apparatuses that can respond to this, demand for the development of fault current limiters that are able to control a fault current is increasing. However, the development of a practical fault current limiting technique has been delayed by technical problems and difficulty in commercialization.

However, after a high temperature superconductor was discovered, it was feasible to develop a fault current limiter using the nonlinear voltage-current characteristics of a high temperature superconductor. In 1987, the development of high temperature superconducting fault current limiters using liquid nitrogen as a refrigerant began in earnest.

Since superconducting materials have nonlinear resistance, they can be used in fault current limiting devices. Studies on a superconducting fault current limiter using liquid helium as a refrigerant have been slow due to the excessive expense required for refrigeration. However, with the development of a superconducting material that is able to use liquid nitrogen as a refrigerant, various superconducting fault current limiters have been proposed.

When a short-circuit in a system is detected, a high temperature superconducting fault current limiter creates a high resistance using a quenching characteristic in which it is quickly transformed from the superconductivity phase to the normal conductivity phase, thus be having like a fuse and limiting the fault current. Furthermore, the fault current limiter is characterized in that after the fault current has been reduced, it returns to the superconductivity phase.

There have been various kinds of superconducting fault current limiters proposed having the above-mentioned characteristics, for example, resistance type, inductance type, hybrid type, etc.

The resistance type superconducting fault current limiter is characterized in that the structure thereof is simple and it has advantages over the inductance type fault current limiter with respect to expense and weight. However, there are problems in that a heat spot occurs during a fault current limiting process and it requires complicated superconductor manufacturing technique.

The inductance type fault current limiter also uses a superconductor in the same manner as the resistance type fault current limiter. However, the superconductor governs the detection of a short-circuit and controls a switch, and a coil is used as a reactor unlike the resistance type fault current limiter. Under normal conditions, a current flows through the superconductor and there is no impedance in the coil due to perfect diamagnetism of the superconductor. When a short-circuit occurs, the superconductor is quenched which creates an impedance in the coil, thus limiting the current. With regard to this type, there are advantages in that it can be designed into various shapes. The inductance type fault current limiter also has low heat generation since it has no resistance factor. Additionally it has low thermal shock at an initial stage of the fault current limiting process, and it is easy to manufacture the superconductor compared to the resistance type limiter. However, there are disadvantages in that its size increases due to the reactor, and waveform deformation may occur due to additional reactance.

Recently, an electronic/inductance hybrid fault current limiter has been developed. In the hybrid fault current limiter, a superconducting reactor and a DC power supply are provided in a semiconductor diode (or SCR) bridge to limit current. Under normal conditions, an outside current flows through the diode. If the amount of outside current exceeds that of an inside direct current when a short-circuit occurs, the outside current passes through a coil so that the reactance thereof limits the current. However, this method is disadvantageous in that, when a short-circuit occurs, voltage is concentrated on one or only some of the winding modules, and thus the winding modules may be damaged.

SUMMARY OF THE INVENTION

Accordingly, the present invention has been made keeping in mind the above problems occurring in the prior art, and an object of the present invention is to provide a fault current limiter which prevents bifilar winding modules from being damaged by a voltage concentrated on one or more bifilar winding modules when a short-circuit occurs, reduces the burden on a current limiting module by dispersing current and limits a fault current using both the resistance of the current limiting module and the inductance of a bypass reactor.

In order to accomplish the above object, the present invention provides a fault current limiter, comprising: a pancake type current limiting module, comprising at least two pancake type bifilar winding modules stacked and connected to each other in series; and a hollow superconducting bypass reactor that has the current limiting module disposed therein.

Each of the pancake type bifilar winding modules includes a bobbin, a first superconducting wire wound around the bobbin in a bifilar manner so as to have minimum inductance, and at least one pair of first metal blocks which are installed and fixed to the bobbin and attached to the first superconducting wire.

A second superconducting wire is wound around the superconducting bypass reactor to connect the bypass reactor to the current limiting module in parallel therewith. The superconducting bypass reactor disperses current that flows through the current limiting module when a short-circuit occurs, thus reducing the recovery time of the current limiting module. The superconducting bypass reactor is not limited to a particular material, as long as it can bypass a high current to the bypass reactor when a short-circuit occurs and a quenching phenomenon consequently occurs in at least one bifilar winding module, and as long as it can evenly apply a magnetic field to the entire current limiting module such that quenching can simultaneously occur in the entire current limiting module. Preferably, the superconducting bypass reactor comprises a hollow bobbin so that the current limiting module can be disposed therein, and the second superconducting wire is wound into a solenoid shape on the circumferential outer surface thereof.

Here, the term "winding" means a combination of turning and coiling, which has a limited function in an electrical apparatus, and the term "bifilar winding" means a winding made of two closely spaced conductors in which the two conductors are connected such that currents therein flow in opposite directions, so that the inductance of the winding is negligible.

BRIEF DESCRIPTION OF THE DRAWINGS

The above and other objects, features and advantages of the present invention will be clearly understood from the following detailed description taken in conjunction with the accompanying drawings, in which.

DESCRIPTION OF THE PREFERRED EMBODIMENTS

Hereinafter, a preferred embodiment of the present invention will be described in detail with reference to the attached drawings. The following explanation is only an example for illustrative purposes and does not limit the scope of the present invention.

Figure 1:
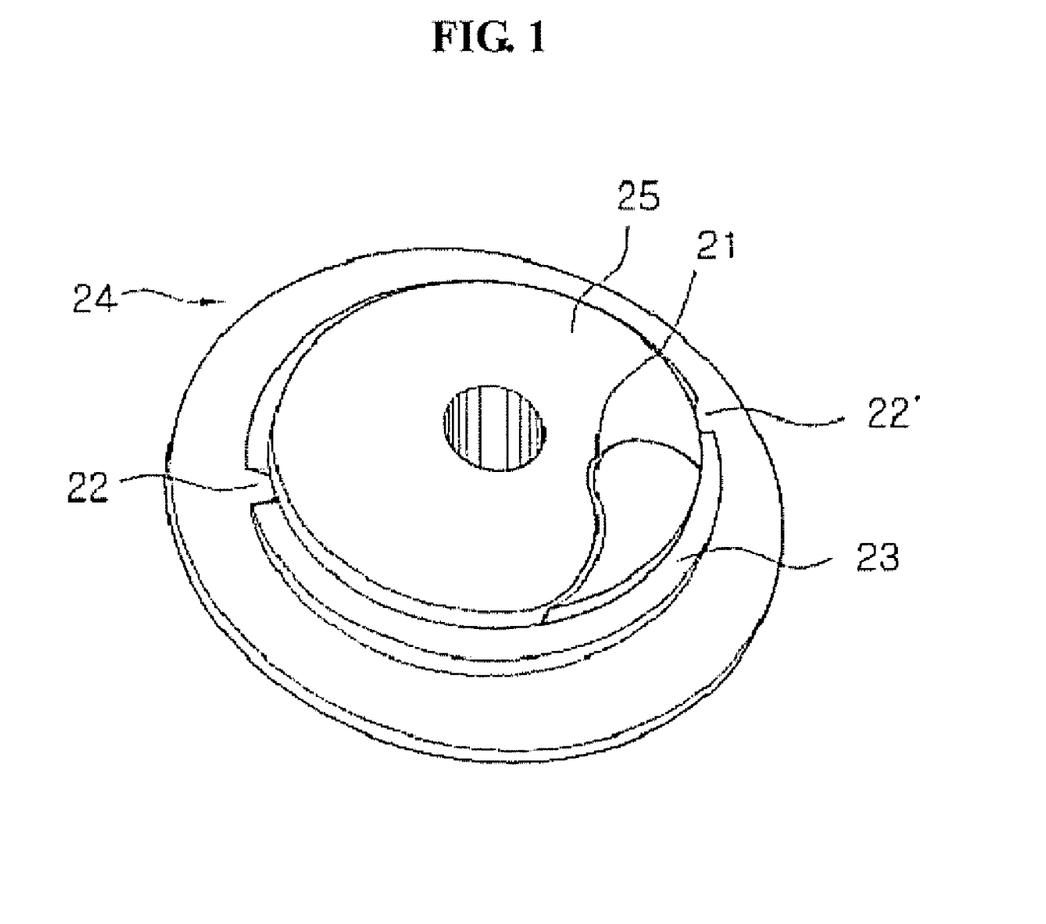
FIG. 1 is a perspective view of a winding bobbin for bifilar winding according to the present invention.
Figure 2:
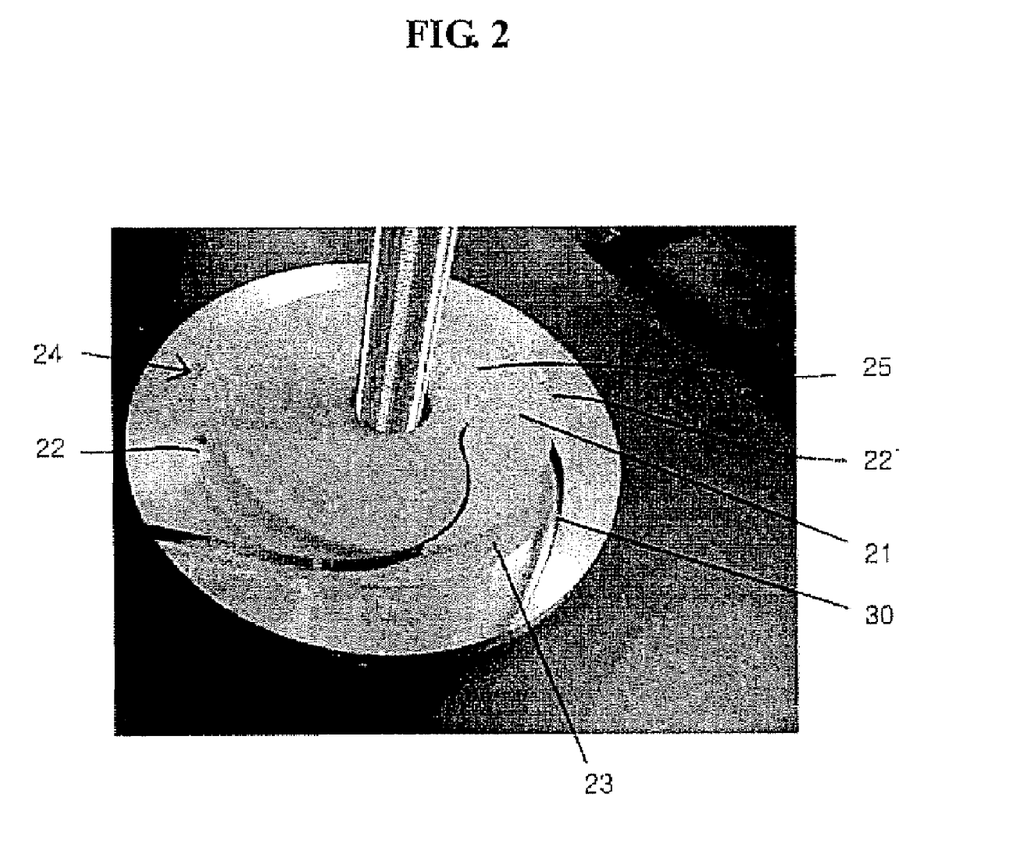
FIG. 2 is a photograph of a first superconducting wire fixed to the winding bobbin of FIG. 1.
Figure 3:
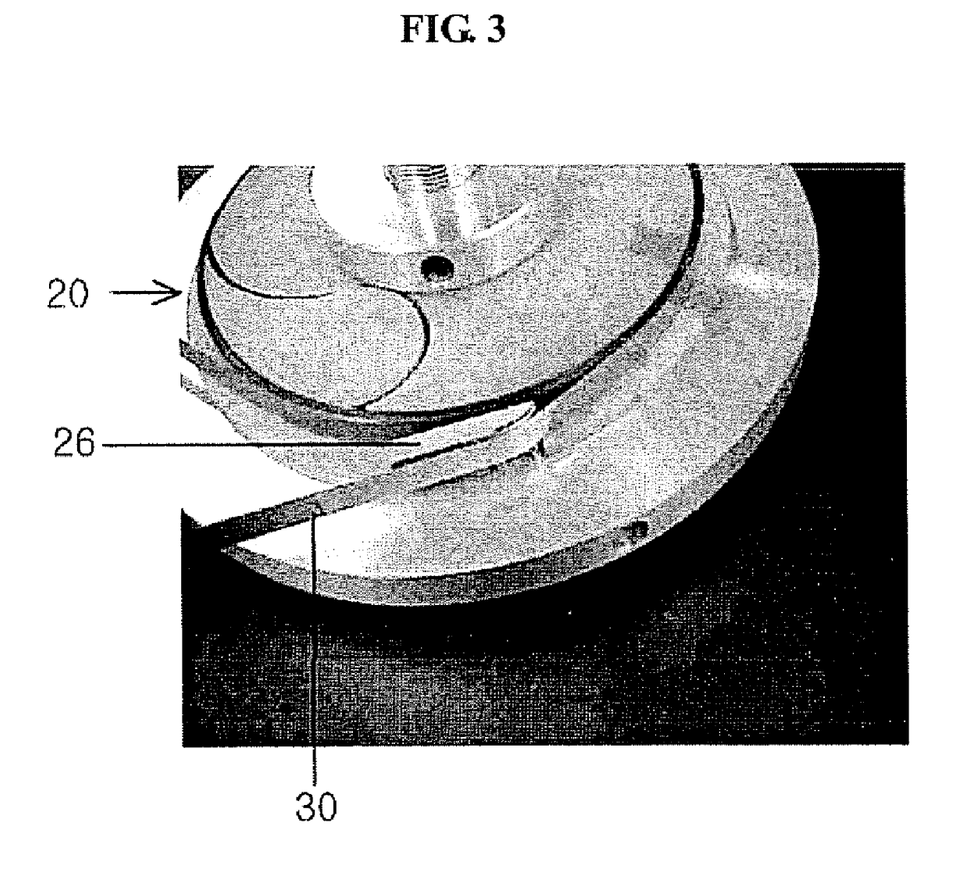
FIG. 3 is a photograph of a first metal block attached to the winding bobbin according to the present invention.
Figure 4:
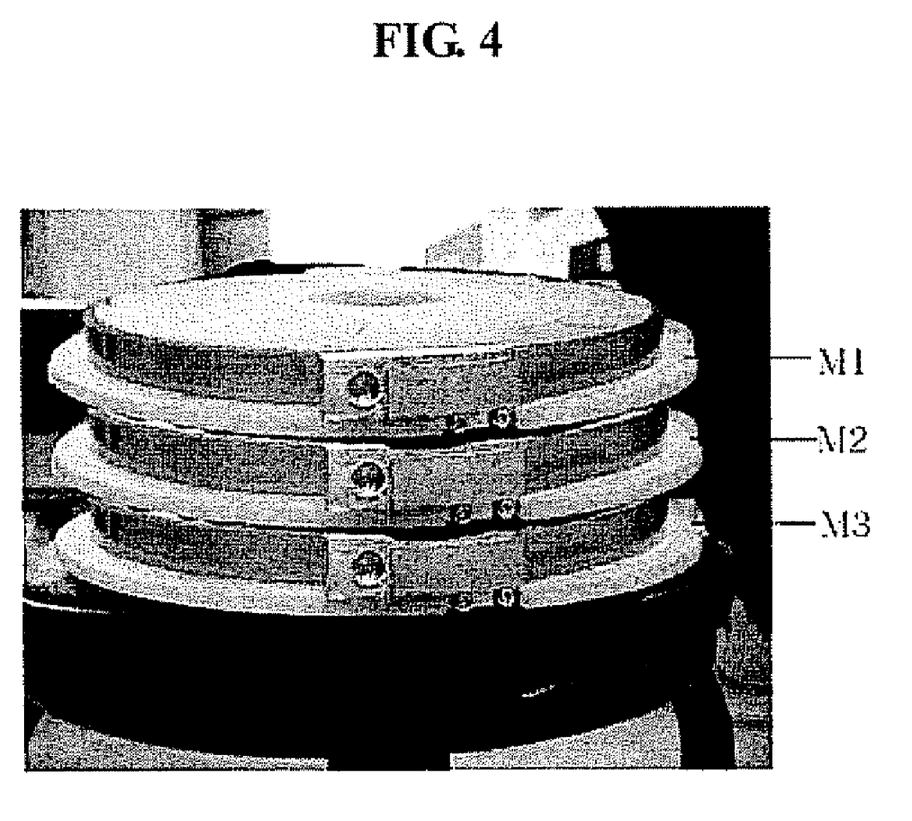
FIG. 4 is a photograph of the coupling between bifilar winding modules according to the present invention.
Figure 5:
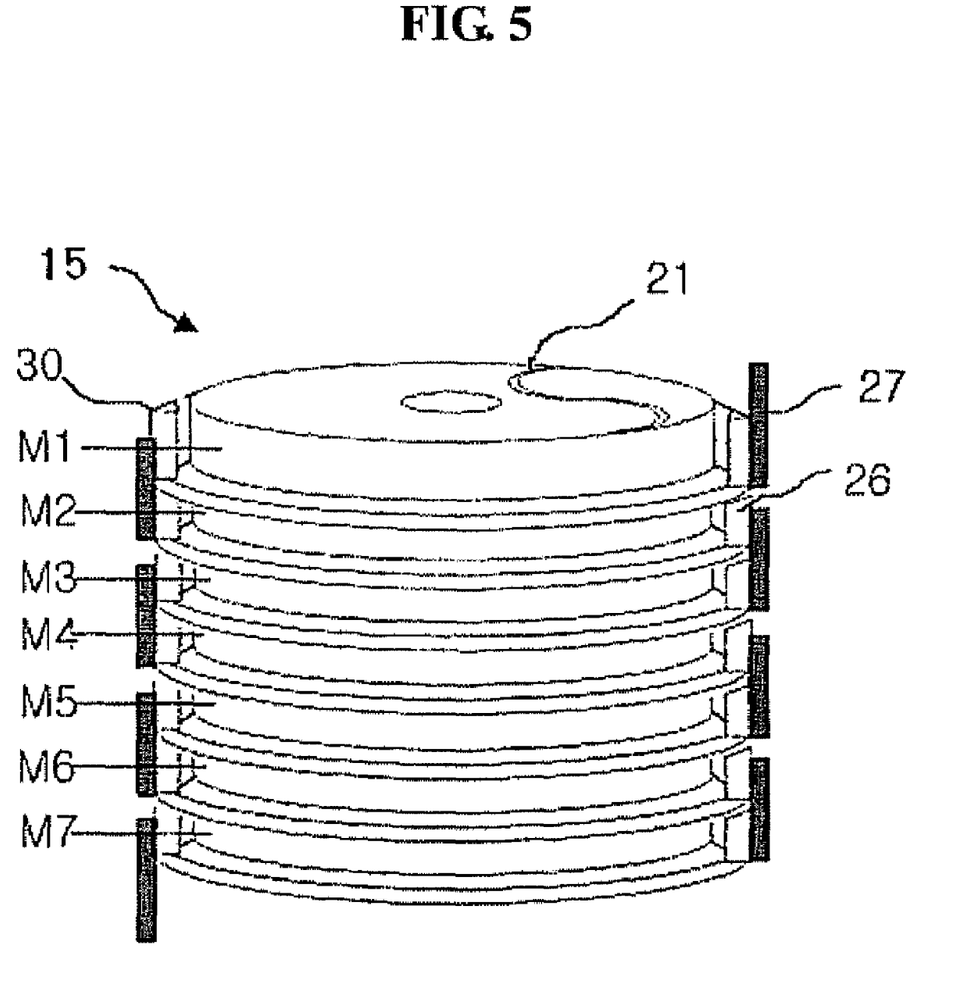
FIG. 5 is a perspective view of a pancake type current limiting module according to the present invention.
Figure 6:
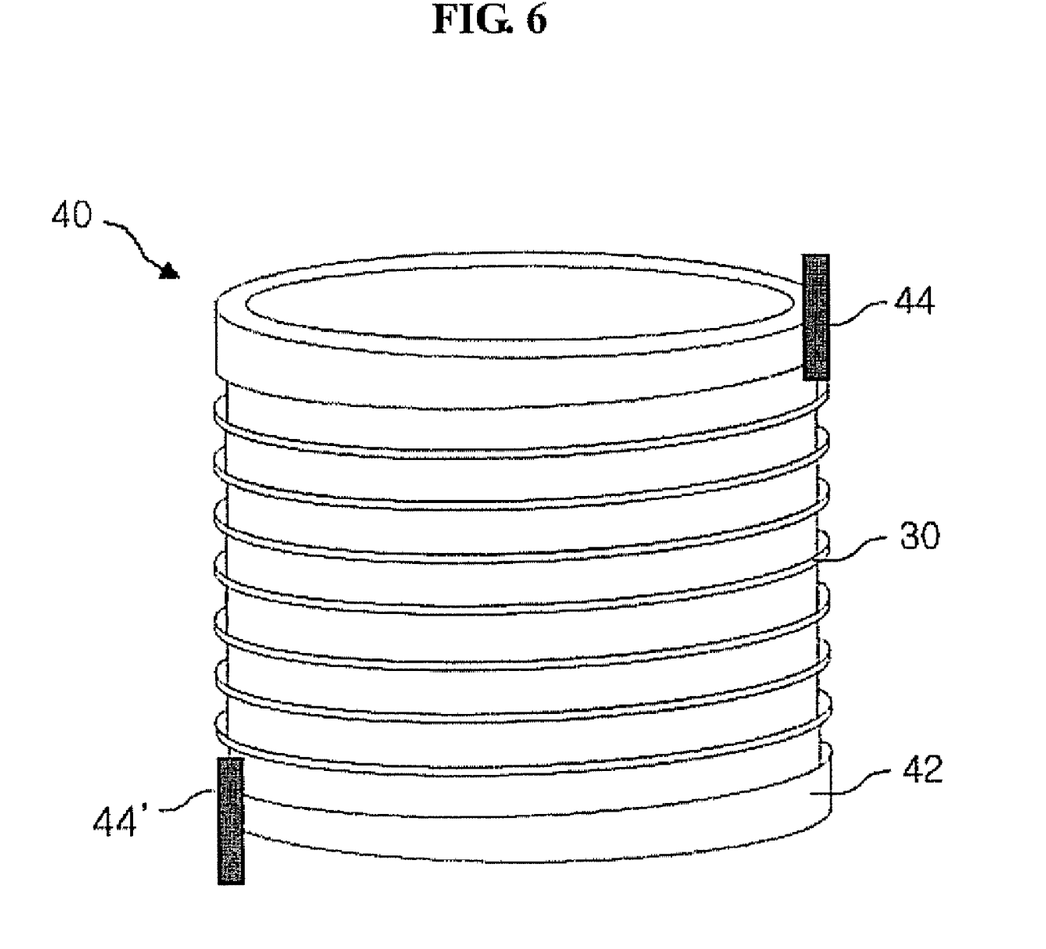
FIGS. 6 is a perspective view of a solenoid type superconducting bypass reactor according to the present invention.
Figure 7:
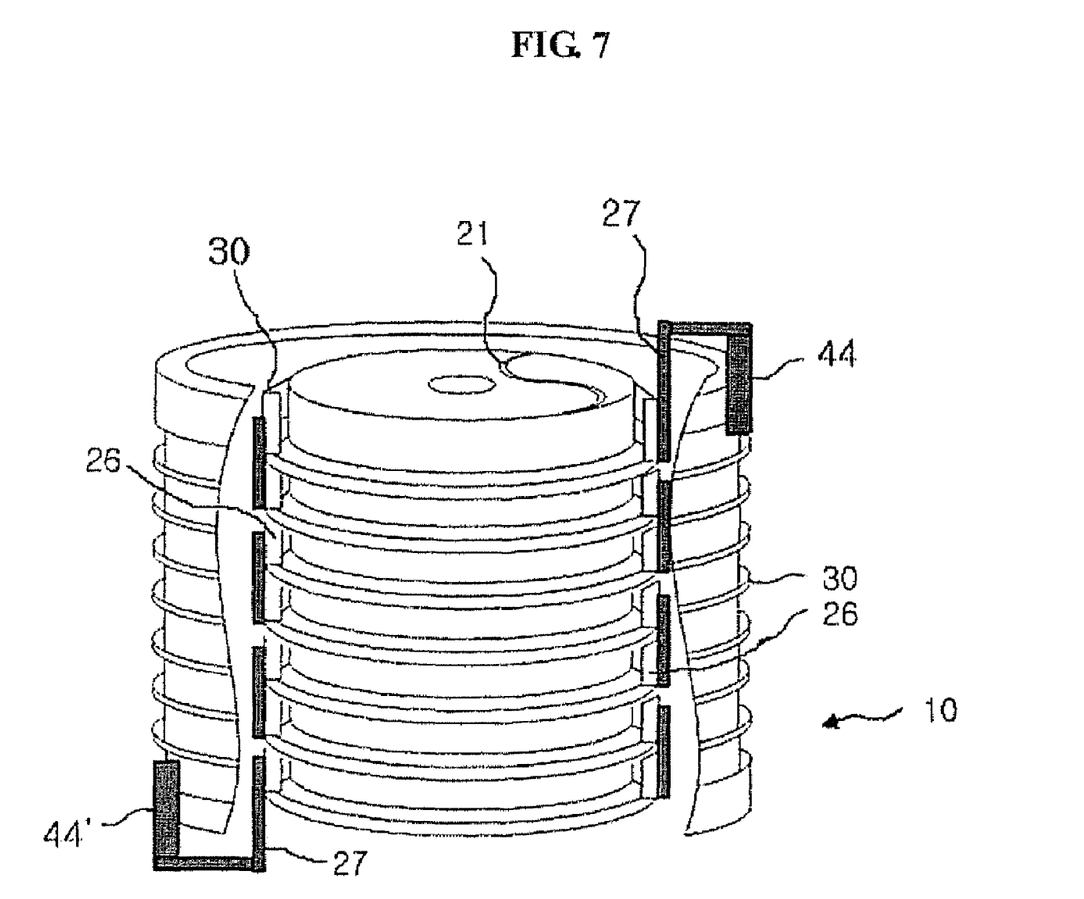
FIG. 7 is a partially broken view showing a fault current limiter, in which the current limiting module is connected to the bypass reactor, according to the present invention.

FIG. 1 is a perspective view of a bifilar winding bobbin of a fault current limiter according to the present invention. FIG. 2 is a photograph of a first superconducting wire fixed to the winding bobbin of FIG. 1. FIG. 3 is a photograph of a first metal block attached to the winding bobbin according to the present invention. FIG. 4 is a photograph of the coupling between non-inductivity winding modules according to the present invention. FIG. 5 is a perspective view of a pancake type current limiting module according to the present invention. FIG. 6 is a perspective view showing a solenoid type superconducting bypass reactor according to the present invention. FIG. 7 is a partially broken view showing the fault current limiter in which the current limiting module is connected to the bypass reactor.

As shown in FIGS. 1 through 7, the fault current limiter 10 includes the pancake type current limiting module 15 and the superconducting bypass reactor 40. The current limiting module 15 consists of at least two pancake type bifilar winding modules 20 connected to each other in series in a stacked arrangement. Each bifilar winding module 20 includes a winding bobbin 24; a first superconducting wire 30 wound around the winding bobbin 24 in a bifilar manner; and first metal blocks 26 installed and fixed to the bobbin 24, and attached to the first superconducting wire 30. The superconducting bypass reactor 40 is hollow so that the current limiting module 15 can be disposed therein. The second superconducting wire 30' is wound around the circumferential outer surface of the superconducting bypass reactor 40, and the superconducting bypass reactor 40 is connected to the current limiting module 15 in parallel therewith.

As shown in FIG. 1, the bifilar winding bobbin 24 includes a cylindrical main body 25 and a cylindrical support base 23. The main body 25 has therein a wire insertion groove 21, which has a depth greater than the width of the first superconducting wire 30 and a radius of curvature greater than the radius of curvature of the first superconducting wire 30, which is preferably within a range from 30 mm to 100 mm, such that the first superconducting wire 30 can be wound in a bifilar manner so as to have minimum inductance. The wire insertion groove 21 guides the first superconducting wire 30 from one position to another position of the main body 25. The support base 23 is provided under the lower surface of the main body 25 and has at least one pair of metal block-fixing notches 22 and 22'.

Since the first superconducting wire 30 is made of a ceramic material, if the first superconducting wire 30 is wound with a radius of curvature smaller than a predetermined radius of curvature, the characteristics of the first superconducting wire 30 abruptly deteriorate or are lost. Therefore, it is preferable that the wire insertion groove 21 have a radius of curvature greater than that of the first superconducting wire 30.

Furthermore, the wire insertion groove 21 is structured to guide the first superconducting wire 30 from one position to another position on the main body 25 of the bobbin 24 such that a medial portion of the first superconducting wire 30 is disposed in the main body 25 of the bobbin 24 in the bent state for bifilar winding.

At least two, and preferably a pair of, metal block-fixing notches 22 and 22' are formed at diametrically opposed positions in the support base 23, so that the first metal blocks 26 are fixed to the respective metal block-fixing notches 22 and 22'.

As shown in FIG. 2, the first superconducting wire 30 is wound around the main body 25 in a bifilar manner with a predetermined tension, and the medial portion of the overall length of the first superconducting wire 30 is bent and disposed in the wire insertion groove 21 of the bobbin 24. Furthermore, the first superconducting wire 30 is not limited to any particular material, as long as the material can be coated with an insulating material and is conductive. Preferably, the first superconducting wire 30 is made of a ceramic material.

Since the first superconducting wire 30 has a tape shape, the first superconducting wire 30 is wound in a pancake shape. It can be wound in a bifilar manner with regard to the characteristics of the first superconducting wire 30, such as its radius of curvature.

Referring to FIG. 3, the first metal blocks 26 make it possible for currents to flow between the adjacent winding modules 20. The first metal blocks 26 are installed and fixed to the respective metal block-fixing notches 22 and 22', which are formed in the support base of the bobbin 24. Furthermore, the first metal blocks 26 are attached to the first superconducting wire 30 that maintains a predetermined tension. Copper or brass is used as the material of the first metal block 26.

Here, it is preferable that the end of each first metal block 26 serving as a current terminal have a curved surface at a portion attached to the first superconducting wire 30.

Furthermore, the first metal blocks 26 may be attached to the first superconducting wire 30 by soldering using a material having a low melting point, such as indium, in order to minimize deterioration of the characteristics of the first superconducting wire 30.

Meanwhile, when bifilar winding modules 20, which are sequentially stacked, are designated as a first bifilar winding module M1, a second bifilar winding module M2 and a third bifilar winding module M3, the several bifilar winding modules M1, M2 and M3 overlap each other and are connected in series to have the shape shown in FIG. 4.

Therefore, thanks to the stacking of the bifilar winding modules 20 as shown in FIG. 4, the length of the winding can be increased.

As shown in FIG. 5, the pancake type current limiting module 15 according to the present invention comprises several bifilar winding modules 20, each of which includes: the bobbin 24, having the main body 25 provided with the wire insertion groove 21 for winding the first superconducting wire 30 in a bifilar manner, the wire insertion groove 21 having a depth greater than the width of the first superconducting wire 30 and a radius of curvature greater than a predetermined value to guide the first superconducting wire from one position to another position on the main body 25, and having the support base 23, which has at least one pair of metal block-fixing notches 22 and 22' and is disposed under the main body 25; the first superconducting wire 30, which is wound in the bifilar manner, maintaining a predetermined tension while a medial portion of the entire length of the first superconducting wire 30 is bent and disposed in the wire insertion groove 21 of the bobbin 24; and the first metal blocks 26, which are installed and fixed to the respective metal block-fixing notches 22 and 22' of the support base 23 of the bobbin 24 and are attached to the first superconducting wire 30 while the first superconducting wire 30 maintains the predetermined tension. The several bifilar winding modules 20 are vertically stacked. In the adjacent bifilar winding modules 20, the support base 23 of the bobbin 24 of the upper bifilar winding module 20 is in contact with the cylindrical body 25 of the bobbin 24 of the lower bifilar winding module 20. Furthermore, second metal blocks 27 are disposed on the first metal blocks 26 of the bifilar winding modules 10 such that the bifilar winding modules 20 are connected to each other in series.

As shown in FIG. 5, the second metal blocks 27 serve to connect the first metal blocks 26, which are disposed on the left and right of the longitudinal cross-section of the current limiting module 15, to each other in series. In detail, one second metal block 27 is disposed on the first metal block 26 positioned to the right of the first bifilar winding module M1. Another second metal block 27 is disposed on the first metal blocks 26 positioned to the left of the first and second bifilar winding modules M1 and M2. Another second metal block 27 is disposed on the first metal blocks 26 positioned to the right of the second and third bifilar winding modules M2 and M3. Another second metal block 27 is disposed on the first metal blocks 26 positioned to the left of the third and fourth bifilar winding modules M3 and M4. Another second metal block 27 is disposed on the first metal blocks 26 positioned to the right of the fourth and fifth bifilar winding modules M4 and M5. Another second metal block 27 is disposed on the first metal blocks 26 positioned to the left of the fifth and sixth bifilar winding modules M5 and M6. Another second metal block 27 is disposed on the first metal blocks 26 positioned to the right of the sixth and seventh bifilar winding modules M6 and M7. Another second metal block 27 is disposed on the first metal block 26 positioned to the left of the seventh bifilar winding module M7.

Here, each of the second metal block 27 is made of copper or brass. Preferably, the same material as that of the first metal block 26 is used as the material of the second metal block 27.

As shown in FIG. 6, the superconducting bypass reactor 40 according to the present invention is connected to the current limiting module 15 in parallel and disperses a current that flows through the current limiting module 15 when a short-circuit occurs, thus reducing the recovery time of the current limiting module 15. The superconducting bypass reactor 40 includes a hollow reactor bobbin 42 so that the current limiting module 15 can be installed therein and connected to the reactor bobbin 42; a second superconducting wire 30' wound around the circumferential outer surface of the reactor bobbin 42 so as to have a solenoid shape; and third metal blocks 44 and 44', which are attached to the second superconducting wire 30', disposed at a predetermined position at the upper end of the reactor bobbin 42 and at a diametrically opposite predetermined position at the lower end of the reactor bobbin 42, respectively. It is preferable that a superconducting magnet be used as the reactor bobbin 42.

Furthermore, each of the third metal block 44, 44' is made of copper and, more preferably, is made of the same material as that of the first and second metal blocks 26 and 27.

The term "recovery time" means the time required from when the first and second superconducting wires 30 and 30' are transformed into normal resistive conductors due to quenching to when the first and second superconducting wires 30 and 30' become superconductors again.

The superconducting bypass reactor 40 is connected to the current limiting module 15 and surrounds the circumferential outer surface of the current limiting module 15. Thus, the magnetic field generated by the superconducting bypass reactor 40 makes simultaneous quenching possible in the bifilar winding modules 20 provided in the superconducting bypass reactor 40, thereby preventing the bifilar winding module 20 from being damaged by the concentration of voltage on only one bifilar winding module 20.

FIG. 7 shows a fault current limiter 10 having the superconducting bypass reactor 40 for simultaneous quenching, assembled in the sequence shown from FIG. 1 to FIG. 6.

That is, the fault current limiter 10 of the present invention comprises: the current limiting module 15, which includes the bifilar winding modules 20 vertically connected to each other in series through the second metal blocks 27 and each having the first superconducting wire 30, the opposite ends of which are attached to the associated first metal blocks 26 fixed to the support base 23 of the associated bobbin 24; and the solenoid type superconducting bypass reactor 40 that surrounds the current limiting module 15 and is connected to the current limiting module 15 in parallel.

To connect the current limiting module 15 and the superconducting bypass reactor 40 to each other in parallel, the uppermost second metal block 27, which is positioned at the upper end of the current limiting module 15, is connected to the third metal block 44 positioned at the upper end of the superconducting bypass reactor 40, and the lowermost second metal block 27, which is positioned at the lower end of the current limiting module 15, is connected to the third metal block 44' positioned at the lower end of the superconducting bypass reactor 40.

The bifilar winding modules are connected to each other in series in the fault current limiter, SO without the superconducting bypass reactor, when a short-circuit occurs, a voltage is unevenly applied to the modules which may cause resistance to concentrate on one bifilar winding module.

To prevent this, the present invention is provided with the superconducting bypass reactor 40 surrounds the current limiting module 15. Therefore, when a short-circuit occurs, current is bypassed to the superconducting bypass reactor 40 so that a quenching phenomenon occurs in at least one bifilar winding module 20. The magnetic field generated at this time is evenly applied to the current limiting module 15, so that simultaneous quenching occurs, thus minimizing the concentration of voltage on one winding module 20.

Furthermore, the present invention has the advantage of a typical bypass reactor, which reduces the burden applied to the current limiting module 15 when a short-circuit occurs. In addition, the present invention can limit a fault current using both the resistance of the current limiting module 15 and the inductance of the bypass reactor 40.

Although the preferred embodiment of the present invention has been disclosed for illustrative purposes, those skilled in the art will appreciate that various modifications, additions and substitutions are possible, without departing from the scope and spirit of the invention as disclosed in the accompanying claims. Therefore, it must be understood that the above-mentioned embodiment is only a representative example, and does not limit the present invention. Furthermore, it is to be interpreted that various modifications, additions and substitutions, which can be derived from the meaning, scope and equivalent concepts of the accompanying claims, fall within the bounds of the present invention.

As described above, the present invention provides a fault current limiter comprising a superconducting bypass reactor that surrounds a pancake type current limiting module connected thereto in parallel, so that when a short-circuit occurs, all winding modules are quenched with a magnetic field at the same time, thus preventing the winding modules from being damaged by the concentration of voltage on one or several winding modules, and reducing the burden on the current limiting module by dispersing current. In addition, the present invention can limit a fault current using both the resistance of the current limiting module and the inductance of the bypass reactor.

What is claimed is:

1. A fault current limiter, comprising:
    a pancake type current limiting module, comprising at least two pancake type bifilar winding modules stacked and connected to each other in series, each of the bifilar winding modules comprising:
    a bobbin, comprising:
        a cylindrical main body provided with a wire insertion groove, which has a depth greater than a width of a first superconducting wire that guides the first superconducting wire from one position to another position on the main body; and
        a cylindrical support base, having at least a pair of metal block-fixing notches, that is disposed under the main body;
    the first superconducting wire wound around the bobbin in a bifilar manner, which maintains a predetermined tension while a medial portion of an entire length of the first superconducting wire is bent and disposed in the wire insertion groove of the bobbin; and
    at least a pair of first metal blocks installed and fixed to a pair of metal block-fixing notches of the support base of the bobbin, the first metal blocks being attached to the first superconducting wire while the first superconducting wire maintains the predetermined tension; and
    a superconducting bypass reactor that has the current limiting module disposed therein, and is connected in parallel with the current limiting module.

2. The fault current limiter as set forth in claim 1, wherein the bifilar winding modules are vertically stacked, the support base of the bobbin of the upper bifilar winding module is in contact with the main body of the bobbin of the lower bifilar winding module, and second metal blocks are deposited on the first metal blocks of the bifilar winding modules such that the bifilar winding modules are connected to each other in series.

3. The fault current limiter as set forth in claim 1, wherein the superconducting bypass reactor comprises:
    a hollow reactor bobbin formed such that the current limiting module is installed therein;
    a second superconducting wire wound around a circumferential outer surface of the reactor bobbin; and
    third metal blocks attached to the second superconducting wire at a predetermined position at the upper end of the reactor bobbin and at a diametrically opposite predetermined position at the lower end of the reactor bobbin, respectively, which connect the reactor bobbin to the current limiting module in parallel.

4. The fault current limiter as set forth in claim 1, wherein the first superconducting wire is made of a ceramic material.

5. The fault current limiter as set forth in claim 1, wherein the bobbin of the superconducting bypass reactor comprises a superconducting magnet.

6. The fault current limiter as set forth in claim 1, wherein each of the first metal blocks is made of copper or brass.

7. The fault current limiter as set forth in claim 3, wherein the second superconducting wire is made of a ceramic material.

* * * * *